United States Patent
Van De Graaff et al.

(10) Patent No.: US 11,456,027 B2
(45) Date of Patent: Sep. 27, 2022

(54) SUSPICIOUS ACTIVITY MONITORING MEMORY SYSTEM

(71) Applicant: Micron Technology, Inc., Boise, ID (US)

(72) Inventors: Scott D. Van De Graaff, Boise, ID (US); Todd J. Plum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 17/095,560

(22) Filed: Nov. 11, 2020

(65) Prior Publication Data
US 2022/0148641 A1     May 12, 2022

(51) Int. Cl.
*G01R 19/165*     (2006.01)
*G11C 11/4078*     (2006.01)

(52) U.S. Cl.
CPC ...... *G11C 11/4078* (2013.01); *G01R 19/1659* (2013.01)

(58) Field of Classification Search
CPC .................. G11C 11/4078; G01R 19/1659
See application file for complete search history.

(56) References Cited

U.S. PATENT DOCUMENTS

| | | | | |
|---|---|---|---|---|
| 5,781,051 A | * | 7/1998 | Sandhu | H03K 17/223 327/143 |
| 5,828,245 A | * | 10/1998 | Brambilla | H03K 17/163 327/170 |
| 2015/0097606 A1 | * | 4/2015 | Koo | H04L 25/0298 327/175 |
| 2015/0318842 A1 | * | 11/2015 | Thakur | G11C 29/021 327/143 |

\* cited by examiner

*Primary Examiner* — Feba Pothen
(74) *Attorney, Agent, or Firm* — Fletcher Yoder, P.C.

(57) ABSTRACT

The present disclosure relates generally to semiconductor devices, and, in particular, to monitoring circuitry configured to monitor a signal for an overcurrent, undercurrent, overvoltage, and/or undervoltage condition. The monitor circuit may utilize pull down transistors to generate a local voltage level. The local voltage level is then used to generate an indication of whether the monitored value has diverged from an operating region and/or has crossed a threshold of operation.

20 Claims, 5 Drawing Sheets

SUSPICIOUS ACTIVITY MONITORING MEMORY SYSTEM

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Semiconductor devices (e.g., processors, memory systems, or the like) may include semiconductor circuits to store and/or process information. An example semiconductor device is a memory device. The memory device may include volatile memory devices, non-volatile memory devices, or a combination device. Memory devices, such as dynamic random-access memory (DRAM), may use electrical energy to store and/or access data. For example, the memory devices may include Double Date Rate (DDR) random-access memory (RAM) devices that use DDR interfacing schemes (e.g., DDR4, DDR5) for high-speed data transfers.

To facilitate the collection of data about the utilization and real-world operating parameters of a semiconductor device, it may be helpful to use data loggers in memory devices to monitor and record such data during usage for later retrieval. This data may be used in diagnostic operations, gathering population data to improve an understanding of conditions and/or environments that the products may be used in, or the like. Data-logging may rely on a relatively high voltage or current, that may degrade parts, to determine one or more parameters. However, if a gate oxide (GOX) rupture occurs due to high voltage operations relating to data-logging, excess charge may be transmitted to the live die of the semiconductor device potentially causing damage or other issues inhibiting proper operation of the memory device.

BRIEF DESCRIPTION OF THE DRAWINGS

Various aspects of this disclosure may better be understood upon reading the following detailed description and upon reference to the drawings in which.

DETAILED DESCRIPTION

Figure 1:
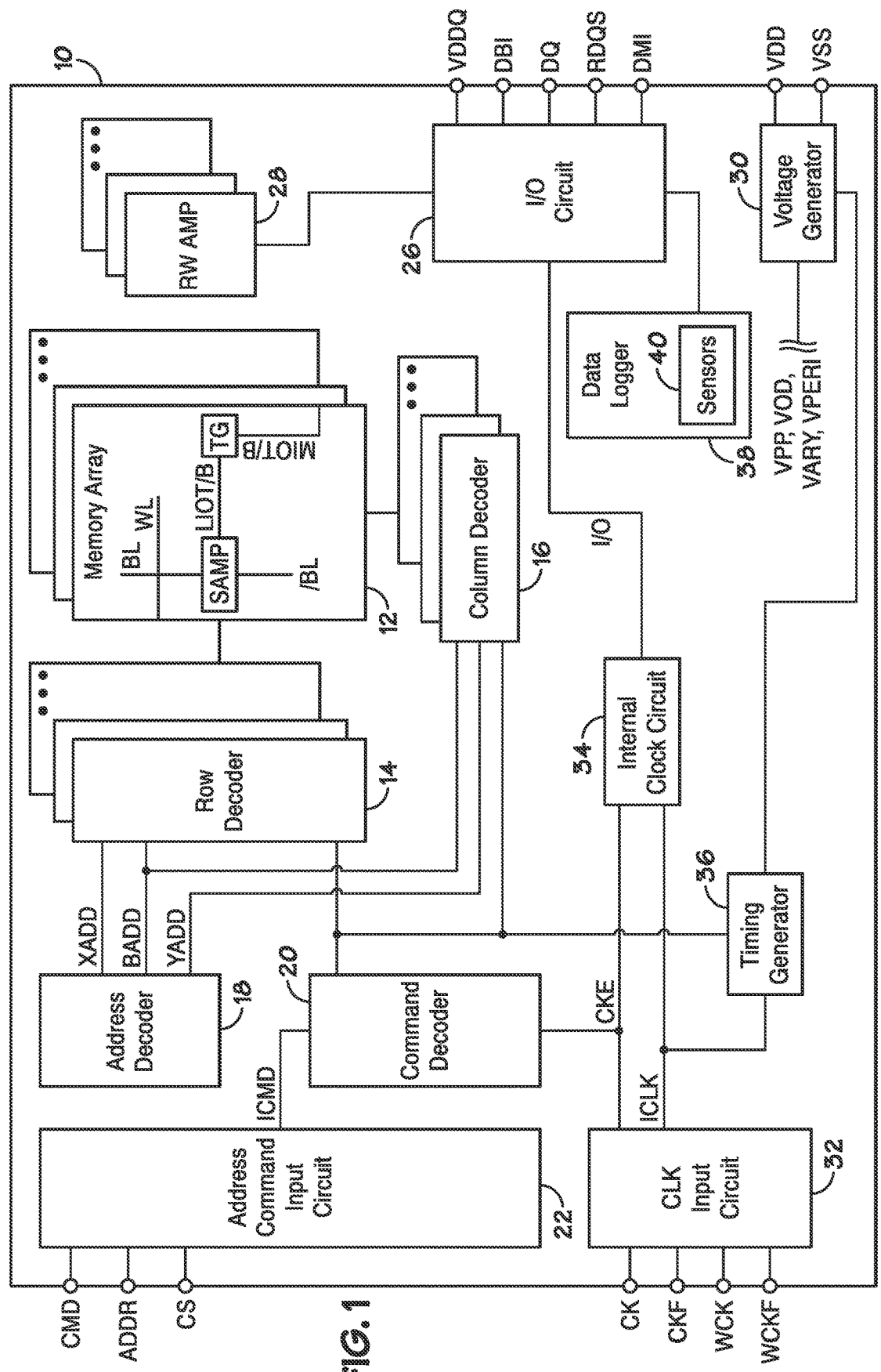
FIG. 1 is a block diagram of a memory device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As an alternative to a non-volatile memory-based data logger, it may be possible to store relevant operating data in less power and space-inefficient ways. For example, if a desired type of operating data involves a duration over which an operating parameter has been experienced (e.g., how many hours a device has been operated in a particular operating temperature range), data logging circuits which utilize a time-dependent change of a material property may be used. One such data logging circuit involves a Complementary metal-oxide-semiconductor (CMOS) device (e.g., a p-channel CMOS (PMOS) device or an n-channel (NMOS) device) circuit that experiences a material degradation proportional to the time for which a known voltage has been applied to a gate thereof. By utilizing such CMOS degradation-based data logging circuits to measure the durations over which different operating parameters have been experienced by a device, it is possible to obtain large quantities of valuable operating data with a small investment of circuit space and power.

As described in greater detail below, the technology disclosed herein relates to electronic systems including memory devices, systems with memory devices, and related methods for storing conditional and/or usage information thereof. The electronic systems (e.g., dynamic random-access memory (DRAM) devices) may include degradation-based storage circuits (e.g., a CMOS degradation-based data logger) configured to collect and store information regarding the duration for which different operating characteristics (e.g., device modes) and/or environmental conditions (e.g., device operating temperatures), are experienced by the electronic systems.

The degradation-based storage circuits may function as low-cost embedded data-loggers that record various information related to an end-user's utilization of the electronic devices/systems. The recorded usage information (e.g., the duration for which different temperature ranges, operating modes, asserted signals, utilized addresses, or the like were experienced) may be used to diagnose operations, improve usage models, revise design specifications, or the like.

In some embodiments, the degradation-based storage circuits may each include a trigger circuit corresponding to a desired parameter or combination of parameters for which a duration is to be measured for coupling a predetermined voltage to the gate of a CMOS device to cause degradation for the duration in which the targeted condition or criteria is active. By degrading the corresponding CMOS device each time the targeted condition(s) occur during operation of the electronic devices/systems, the cumulative degradation of the CMOS device (which may be measured via a circuit that measures a trigger voltage of the CMOS device) may be used to determine the cumulative duration for which the corresponding trigger condition was active.

Because the potential degradation of a single CMOS device is not infinite, various embodiments may provide various connection topologies for coupling multiple CMOS devices to one or more trigger circuits (e.g., backup transistors) so that exhausted or defective CMOS devices may be swapped for fresh, not-yet-degraded CMOS devices. This may permit monitoring durations to continue longer than a single CMOS may permit (e.g., an operational time period of one transistor). Examples of these various embodiments, as well as other information related to degradation-based monitoring techniques and/or descriptions related to particular sensing circuitry described generally herein (such as in reference to FIG. 3), are discussed in co-pending and commonly assigned U.S. patent application Ser. No. 16/138, 900, entitled "A SEMICONDUCTOR DEVICE WITH A DATA-RECORDING MECHANISM" and filed on Sep. 21, 2018 and U.S. patent application Ser. No. 16/387,114, entitled "SUSPICIOUS ACTIVITY MONITORING MEMORY SYSTEM" and filed on Apr. 17, 2019. These applications are incorporated by reference herein and in its entirety.

Because the cumulative degradation of the CMOS device is predictable, the output from a recording circuit (e.g., a circuit that outputs and/or determines a trigger voltage of the CMOS device and/or a circuit that outputs and/or determines a signal corresponding to a material degradation proportional to a duration of time that a stress signal is applied to a circuit, such as a CMOS device) may be determined to correspond to different alarm levels, and thus may be used in a larger control system and/or monitoring system. In this way, the recording circuit output may be provided to a sensitivity detector within a detection block to generate an alarm signal based on a reference voltage within the detection block defining when the alarm signal is generated. It is noted that any number of recording circuits, outputs, sensitivity detectors, detection blocks, and generated alarms may be used in any suitable combination with each other, in addition to the particular examples described herein. This described alarm system may benefit from each of the benefits afforded to the electronic devices/systems (e.g., the operation of the electronic devices/systems) and thus may provide an improved monitoring and/or detection circuit at least in the ways described above and at least relative to current monitoring and detecting techniques.

Using the degradation techniques discussed herein, a relatively large voltage (e.g., 1V, 3.3V, 5V, 12V, 18V, etc.) may be applied to detect degradation as a method of monitoring a status and/or status of a duration of the status. However, if a gate oxide (GOX) of a device subjected to the voltage fails, internal circuitry of the device may be subjected to a relatively large current (e.g., 1 mA) that may potentially damage parts other than the part intended to be subjected to degradation. To detect such scenarios, a monitoring circuit may be used to monitor the voltage and/or current. When an overvoltage, undervoltage, overcurrent, or undercurrent condition occurs, the monitor circuit may cut off one or more amplifiers to stop and/or reduce power transmitted to the internal circuitry. In some scenarios, these conditions may overlap or be indicative of another condition. For example, when an undervoltage condition occurs, Ohm's law may be applied to determine that an overcurrent condition also exists.

Keeping the foregoing in mind, FIG. 1 is a block diagram of an electronic device (e.g., a semiconductor memory device, such as a DRAM device). The memory device 10 may include an array of memory cells, such as memory array 12. The memory array 12 may include banks (e.g., banks 0-15 in the example of FIG. 1). Each bank may include word lines (WL), bit lines (BL), and memory cells arranged at intersections of word lines and the bit lines. Memory cells may include any one of a number of different memory media types, including capacitive, magnetoresistive, ferroelectric, phase change, or the like. The selection of a word line may be performed by a row decoder 14, and the selection of a bit line may be performed by a column decoder 16. Sense amplifiers (SAMP) may be provided for corresponding bit lines and connected to at least one respective local input/output (I/O) line pair (LIOT/B), which may in turn be coupled to at least a respective one main I/O line pair (MIOT/B), via transfer gates (TG), which may operate as switches. The memory array 12 may also include plate lines and corresponding circuitry for managing their operation.

The memory device 10 may use external terminals that include command and address terminals coupled to a command bus and an address bus to receive command signals (CMD) and address signals (ADDR), respectively. The memory device 10 may further include a chip select terminal to receive a chip select signal (CS), clock terminals to receive clock signals (CK and CKF), data clock terminals to receive data clock signals (WCK and WCKF), data terminals (DQ, RDQS, DBI, and DMI), and power supply terminals (VDD, VSS, VDDQ, and VSSQ).

The command terminals and address terminals may be supplied with an address signal and a bank address signal from outside. The address signal and the bank address signal supplied to the address terminals may be transferred, via a command address input circuit 22, to an address decoder 18. The address decoder 18 may receive the address signals and supply a decoded row address signal (XADD) to the row decoder 14, and a decoded column address signal (YADD) to the column decoder 16. The address decoder 18 may also receive the bank address signal (BADD) and supply the bank address signal to both the row decoder 14 and the column decoder 16.

The command and address terminals may be supplied with command signals (CMD), address signals (ADDR), and chip select signals (CS), from a memory controller. The command signals may represent various memory commands from the memory controller (e.g., including access commands, which may include read and/or write commands). The select signal may be used to select the memory device 10 to respond to commands and address provided to the command and address terminals. When an active chip select signal is provided to the memory device 10, the commands and addresses may be decoded and memory operations may be performed. The command signals may be provided as internal command signals (ICMD) to a command decoder 20 via a command address input circuit 22. The command decoder 20 may include circuits to decode the internal command signals to generate various internal signals and commands for performing memory operations, such as a row command signal to select a word line and a column command signal to select a bit line. The internal command signals may also include output and input activation commands, such as clocked command (CMDCK). The command decoder 20 may further include one or more registers for tracking various counts or values (e.g., counts of refresh commands received by the memory device 10 and/or self-refresh operations performed by the memory device 10).

When a read command is issued and a row address and a column address are timely supplied with the read command, the read data may be read from memory cells in the memory array 12 designated by the row address and column address. The read command may be received by the command decoder 20, which may provide internal commands to the I/O circuit 26 so that read data may be output from the data terminals via read/write amplifiers 28 and the I/O circuit 26 according to the clock signals. The read data may be provided at a time defined by read latency information (RL)

that may be programmed in the memory device 10, such as in a mode register (not shown in FIG. 1). The read latency information may be defined in terms of clock cycles of the clock signal (CK). For example, the read latency information may be a number of clock cycles of the clock signal (e.g., CK) after the read command is received by the memory device 10 when the associated read data is provided.

When a write command is issued and a row address and a column address are timely supplied with the write command, write data may be supplied to the data terminals according to the clock signals (e.g., WCK and WCKF). The write command may be received by the command decoder 20, which may provide internal commands to the I/O circuit 26 so that the write data is received by data receivers in the I/O circuit 26, and supplied via the I/O circuit 26 and the read/write amplifiers 28 to the memory array 12. The write data may be written in the memory cell designated by the row address and the column address. The write data may be provided to the data terminals at a time that is defined by write latency (WL) information. The write latency information may be programmed in the memory device 10, such as in the mode register (not shown in FIG. 1). The write latency information may be defined in terms of clock cycles of the clock signal (CK). For example, the write latency information may be a number of clock cycles of the clock signal (CK) after the write command is received by the memory device 10 when the associated write data is received.

The power supply terminals may be supplied with power supply potentials (VDD and VSS). These power supply potentials (VDD and VSS) may be supplied to an internal voltage generator circuit 30. The internal voltage generator circuit 30 may generate various internal potentials (VPP, VOD, VARY, VPERI, and the like) based on the power supply potentials (VDD and VSS). The internal potential (VPP) may be used in the row decoder 14, the internal potentials (VOD and VARY) may be used in the sense amplifiers included in the memory array 12, and the internal potential (VPERI) may be used in many other circuit blocks.

The power supply terminal may also be supplied with a power supply potential (VDDQ). The power supply potential (VDDQ) may be supplied to the I/O circuit 26 together with the power supply potential (VSS). The power supply potential (VDDQ) may be the same potential as the power supply potential (VDD) in an embodiment of the present technology. The power supply potential (VDDQ) may be a different potential from the power supply potential (VDD) in another embodiment of the present technology. However, the dedicated power supply potential (VDDQ) may be used for the I/O circuit 26 so that power supply noise generated by the I/O circuit 26 does not propagate to the other circuit blocks.

The clock terminals and data clock terminals may be supplied with external clock signals and complementary external clock signals. The external clock signals (CK, CKF, WCK, and WCKF) may be supplied to a clock input circuit 32. Some clock signals (CK and CKF, WCK and WCK) may be complementary. Complementary clock signals may have opposite clock levels and transition between the opposite clock levels at the same time. For example, when a clock signal is at a low clock level, a complementary clock signal is at a high level, and when the clock signal is at a high clock level, the complementary clock signal is at a low clock level. Moreover, when the clock signal transitions from the low clock level to the high clock level, the complementary clock signal transitions from the high clock level to the low clock level, and when the clock signal transitions from the high clock level to the low clock level, the complementary clock signal transitions from the low clock level to the high clock level.

Input buffers included in the clock input circuit 32 may receive the external clock signals. For example, when enabled by a signal (CKE) from the command decoder 20, an input buffer may receive the clock signals (CK, CKF, WCK, and WCKF). The clock input circuit 32 may receive the external clock signals to generate internal clock signals (ICLK). The internal clock signals may be supplied to an internal clock circuit 34. The internal clock circuit 34 may provide various phase and frequency controlled internal clock signals based on the received internal clock signals and a clock enable signal (CKE) from the command address input circuit 22. For example, the internal clock circuit 34 may include a clock path (not shown in FIG. 1) that receives the internal clock signals and provides various clock signals to the command decoder 20. The internal clock circuit 34 may further provide input/output (I/O) clock signals. The I/O clock signals used as a timing signal may be supplied to the I/O circuit 26 for determining an output timing of read data and the input timing of write data. The I/O clock signals may be provided at multiple clock frequencies so that data may be output from and/or input to the memory device 10 at different data rates. A higher clock frequency may be desirable when high memory speed is desired. A lower clock frequency may be desirable when lower power consumption is desired. The internal clock signals may also be supplied to a timing generator 36 and used to generate various internal clock signals.

The memory device 10 may couple to any suitable electronic device that uses at least a portion of memory for temporary and/or persistent storage of information as a host device. For example, the host device may include a desktop or portable computer, a server, a hand-held device (e.g., a mobile phone, a tablet, a digital reader, a digital media player), or at least a portion of processing circuitry, such as a central processing unit, a co-processor, a dedicated memory controller, or the like. The host device may sometimes be a networking device (e.g., a switch, a router) or a recorder of digital images, audio and/or video, a vehicle, an appliance, a toy, or any one of a number of other products. In one embodiment, the host device may be connected directly to memory device 10, although in other embodiments, the host device may be indirectly connected to the memory device 10 (e.g., over a networked connection or via communication with intermediary devices).

The memory device 10 may include a data logging circuit 38 (data logger) for logging data from one or more sensors 40 and/or from other components of the device (e.g., the command address input circuit 22, one or more of the decoders 14/16/18/20). The data logging circuit 38 may include a complementary metal-oxide-semiconductor (CMOS) device (e.g., a p-channel CMOS (PMOS) device or an n-channel (NMOS) device) configured to degrade (e.g., negative-bias temperature instability-based (NBTI-based) degradation and/or carrier hot channel-based (CHC-based) degradation according to the targeted usage information. In this way, the data logging circuit 38 is a network of sensors, measuring circuitry, and recording circuitry. The memory device 10 may further adjust and/or vary the amount of degradation for each occurrence to compensate for other factors or conditions (e.g., operating temperature) that influence degradation. In some embodiments, the memory device 10 may adjust the amount of degradation by adjusting a stress voltage used to degrade the CMOS. In some embodiments, the memory device 10 may adjust a duty cycle of a stress input used to degrade the CMOS. Although shown as a separate functional block in FIG. 1, the memory device 10 may include the data logging circuit 38 within any of the other components described above, such as the command address input circuit 22, the I/O circuit 26, or the like. Also, the memory device 10 may include other connections for the data logging circuit 38. For example, the data logging circuit 38 may couple to other circuits, such as the command address input circuit 22, one or more of the decoders 14/16/18/20, or the like, for including trigger conditions therefrom.

Keeping the forgoing in mind, the data logging circuit 38 may be generally referred to as a recording circuit that receives a suspicious activity (SA) signal from the one or more sensors 40. Although described in terms of SA detection and general preventive operations, it should be appreciated that the data logging circuit 38 may record and/or track outputs from the sensors 40 for a variety of applications and/or purposes and may record and/or track parameters using any of the variations described above.

Figure 2:
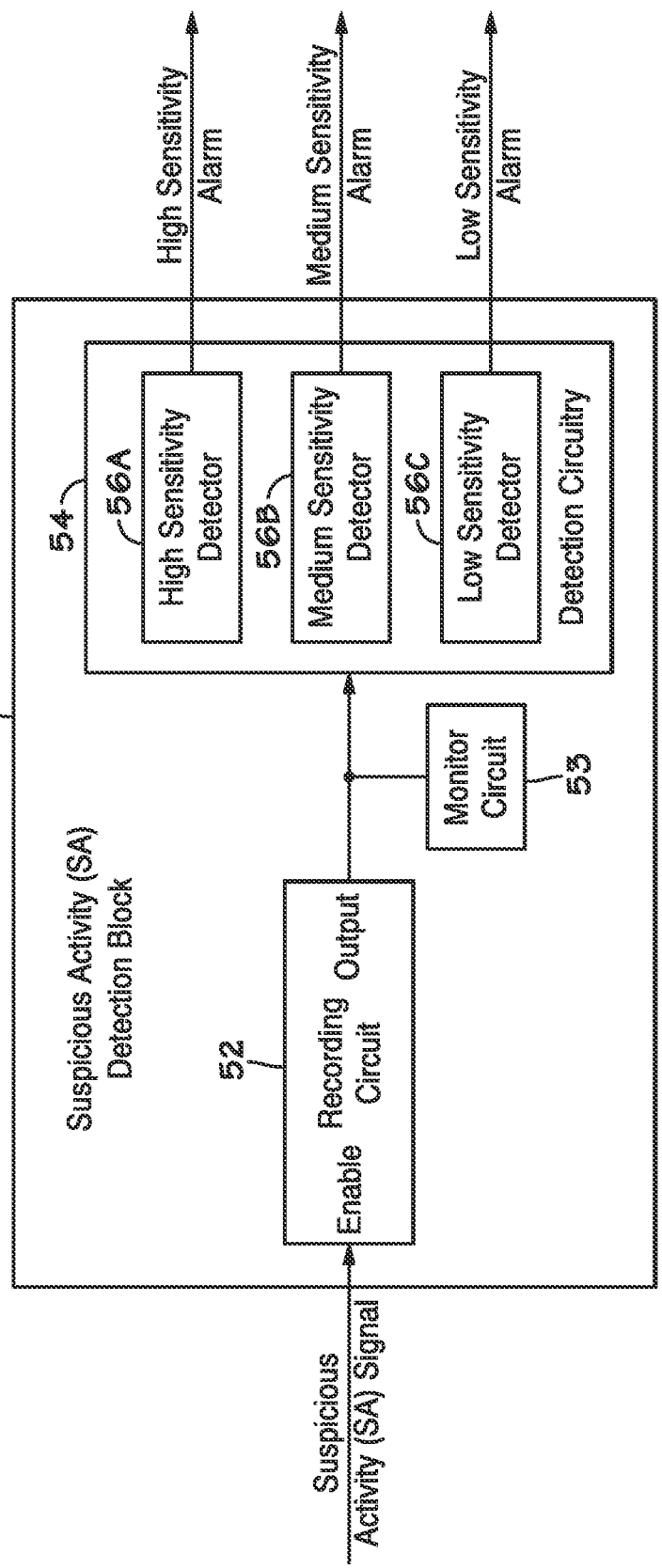
FIG. 2 is a block diagram of a suspicious activity detection block having a monitor circuit, in accordance with an embodiment of the present disclosure.

This relationship may be generalized in FIG. 2. FIG. 2 is a block diagram of a suspicious activity (SA) detection block 50. The example of the SA detection block 50 of FIG. 2 includes a recording circuit 52, a monitor circuit 53, and detection circuitry 54. The recording circuit 52 may be any suitable data logging and/or recording circuitry suitable for use with a memory device (e.g., memory device 10). As previously noted, the monitor circuit 53 may monitor the output of the recording circuit 52 that may be applied to a gate of a transistor (e.g., PMOS driver) of an amplifier (e.g., non-inverting amplifier) of the SA detection block 50, such as an amplifier in the detection circuitry 54. When the output to the gate has an overcurrent, overvoltage, undercurrent, and/or undervoltage condition, the monitor circuit 53 may turn off the amplifier to protect downstream circuitry.

The detection circuitry 54 may detect whether a particular input, or a particular operating condition, to the memory device 10 and/or the memory array 12 is of a suitable level to cause generation of an alarm. The particular inputs may include and/or be associated with a row hammering parameter, an accessing parameter, a temperature parameter, a voltage load parameter, a current load parameter, a stress parameter, or the like. In this way, the detection circuitry 54 may include detectors 56 of varying sensitivities to detect different levels or urgencies of alarms. For example, the detection circuitry 54 includes a high sensitivity detector 56A, a medium sensitivity detector 56B, and a low sensitivity detector 56C, each respectively capable of outputting a separate alarm corresponding to a respective urgency level of an input signal. However, some embodiments, may include any other suitable number of detectors 56, such as 1, 2, 4, 5, or more detectors 56.

The suspicious activity (SA) signal may be received via the recording circuit 52. In response to receiving the SA signal, the recording circuit 52 may record one or more parameters about the signal and vary its output to the detection circuitry 54 based at least in part on the one or more parameters as recorded over time. The detection circuitry 54 may receive the output from the recording circuit 52 and determine whether a value of the output is suitably high to activate one of its alarms.

Figure 3:
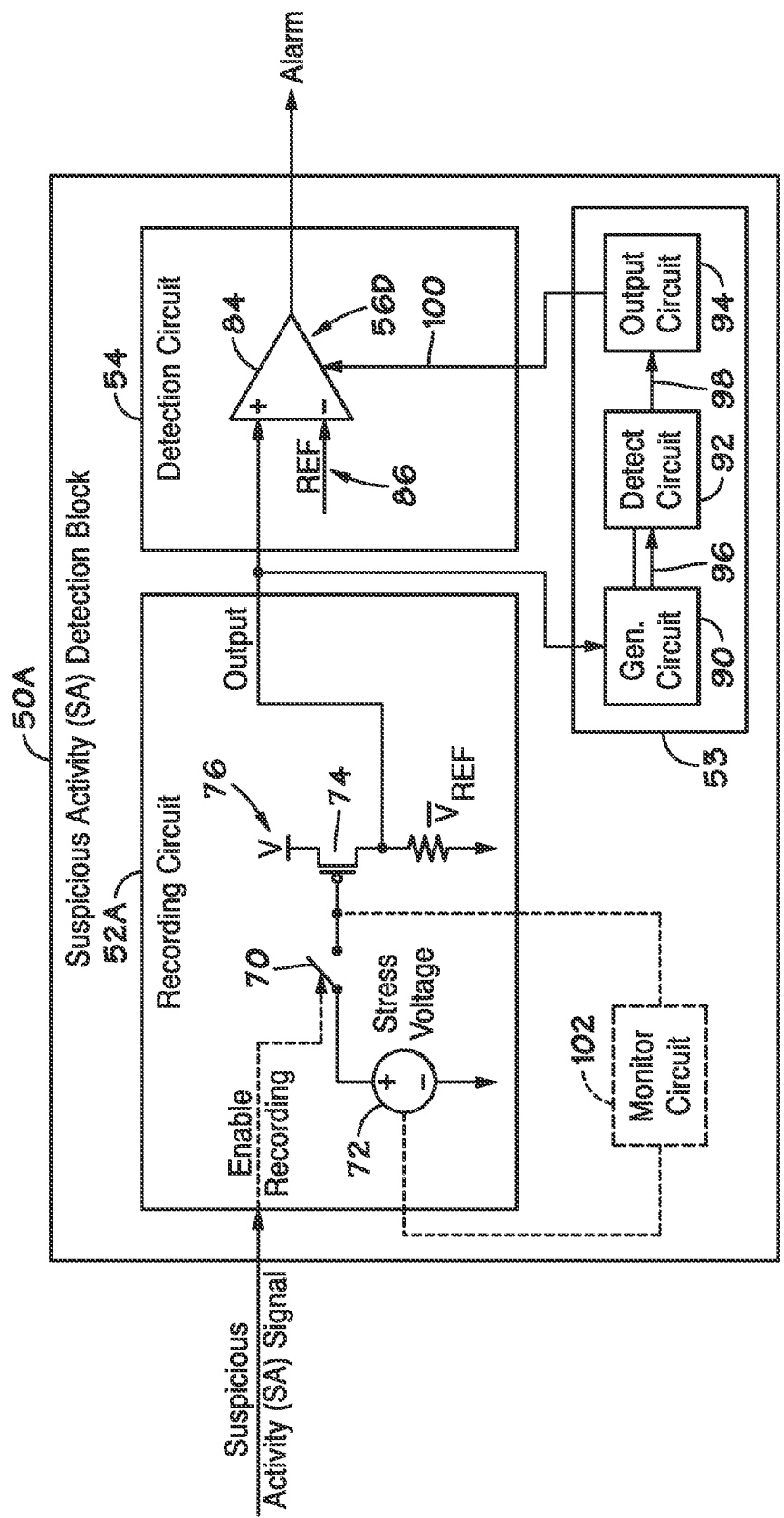
FIG. 3 is a block diagram of an example of the suspicious activity detection block of FIG. 2, in accordance with an embodiment of the present disclosure.

An example of the SA detection block 50 is shown in FIG. 3. FIG. 3 is a block diagram of an embodiment of an SA detection block 50A. The SA detection block 50A includes an example of a recording circuit 52A that uses at least some of the data logging circuit 38 to record one or more parameters associated with the SA signal. As depicted, the SA signal actuates a switch 70 within the recording circuit 52A. The switch 70 may be any suitable device that actuates in response to a control signal. Thus, the parameter of the SA signal that this example of the recording circuit 52A records is the duration of time that the SA signal is enabled (e.g., logic high for the circuitry and/or "1").

When the switch 70 is actuated, a stress voltage 72 is applied to a gate of a transistor 74. Once the SA signal is disabled (e.g., logic low for the circuitry and/or "0"), the switch 70 returns to its zero-state and the stress voltage 72 is stopped from being applied to the gate of the transistor 74. Thus, the gate of the transistor 74 receives the stress voltage 72 for the duration of time that the SA signal is enabled.

It is noted that while the transistor 74 is depicted as a single transistor, the transistor 74 may be of any suitable component that may degrade a predictable amount. For example, the transistor 74 may represent a CMOS-degradation-based sensor that includes one or more PMOS and/or NMOS devices. Furthermore, in some embodiments, the transistor 74 may include one or more PMOS devices and/or NMOS devices. When the transistor 74 is a PMOS device, the transistor 74 may degrade according to NBTI and the gate of the PMOS device may be coupled to the stress voltage 72 and/or intervening logic (and/or components) between the PMOS device and the stress voltage 72, such as the switch 70. Additionally, the drain of the PMOS device may be coupled to the detection circuitry 54, a resistor to ground, a feedback line to the intervening logic and/or components, or the like. When the transistor 74 is an NMOS device, the transistor 74 may degrade according to CHC. In these cases, the gate of the NMOS device may be coupled to the stress voltage 72 and/or intervening logic (and/or components) between the NMOS device and the stress voltage 72, the drain may couple to the stress voltage 72, and the source may be coupled to the detection circuitry 54, a resistor to ground, a feedback line to the intervening logic and/or components, or the like.

Furthermore, in some embodiments, the transistor 74 may include an NMOS device and degrade according to a channel-initiated secondary electron generation (CHISEL). In this case, the NMOS device may have its gate coupled directly to the drain, where both the gate and the drain couple directly to the stress voltage. The NMOS device may have its source coupled to a relatively large resistor permitting a relatively large drain-to-bulk voltage (e.g., a high electric field). However, since the large resistor is coupled to the source, the current used to degrade the NMOS device is maintained relatively small, enabling power consumption to remain relatively low during degradation.

In each of these described examples, the transistor 74 may degrade a predictable amount based at least in part on the amount of time that the stress voltage 72 is received via the gate. An output from the transistor 74 (e.g., a voltage output from the drain and/or source of the transistor 74) may generally change based at least in part on the amount of degradation the transistor 74 has cumulatively undergone while a driving voltage (V) (e.g., reference arrow 76) remains generally constant. Thus, a particular sensitivity detector 56D of the detection circuitry 54 may use the output from the transistor 74 to determine whether or not an alarm is to be generated in response to the how long the SA signal has been enabled over time. For example, the sensitivity detector 56D may include a comparison circuit (e.g., a comparator 84) that compares the output from the transistor 74 to a reference value (e.g., reference voltage 86, a suitable reference current) to determine whether the output from the transistor 74 is large enough to activate an alarm.

The alarm generated may be used to notify an operator when the suspicious activity has occurred longer than a suitable amount of time. The suitable amount may be defined by the sensitivity detector 56D and/or by the reference value. In this way, the alarm output from the comparator 84 may be used to drive an alarming circuit, may be used as a signal to initiate notifying the operator, may be received by a control system and/or a control circuit that changes an operation of the memory device 10 in response to the alarm, or the like. The comparator 84 may include a non-inverting amplifier that may have a feedback loop with a corresponding resistance value based on an amplification factor where the feedback loop is connected to the inverting input and the reference voltage 86.

To prevent propagating signals when the output is outside of defined parameters (e.g., undercurrent, overcurrent, undervoltage, and/or overvoltage), the monitor circuit 53 may monitor one or more parameters of the output. The monitor circuit 53 may include a generation circuit 90, a detect circuit 92, and an output circuit 94. As will be discussed below, the generation circuit 90 receives the output of the recording circuit (or some other electrical signal) and generates a local voltage level 96. The detect circuit 92 receives the generated local voltage level 96 and controls one or more transistors using the local voltage level 96 to determine whether an event has occurred and outputs an indication 98 using the one or more transistors. The output circuit 94 receives the indication 98 and outputs one or more signals 100 that may be used to shut down the comparator 84 to stop propagation to alarming circuitry. In some embodiments, the memory device 10 may include only a single monitor circuit 53 in the illustrated location or in any other alternative location where a voltage and/or current is to be monitored. Alternatively, multiple monitor circuitry 53 may be included in the memory device 10. For instance, although the illustrated monitor circuit 53 is used to monitor the output of the recording circuit 52, a similar monitor circuit 102 may be located at any location within the SA detection block 50A or any other location within the memory device 10. For example, in addition to or alternative to the monitor circuit 53, the monitor circuit 102 may be included to monitor a voltage at a gate of the transistor 74. When the voltage deviates from defined parameters, the monitor circuit 102 may disable the stress voltage 72 and/or the switch 70 to prevent propagation of the stress voltage (or resulting signals) from being transmitted downstream.

Figure 4:
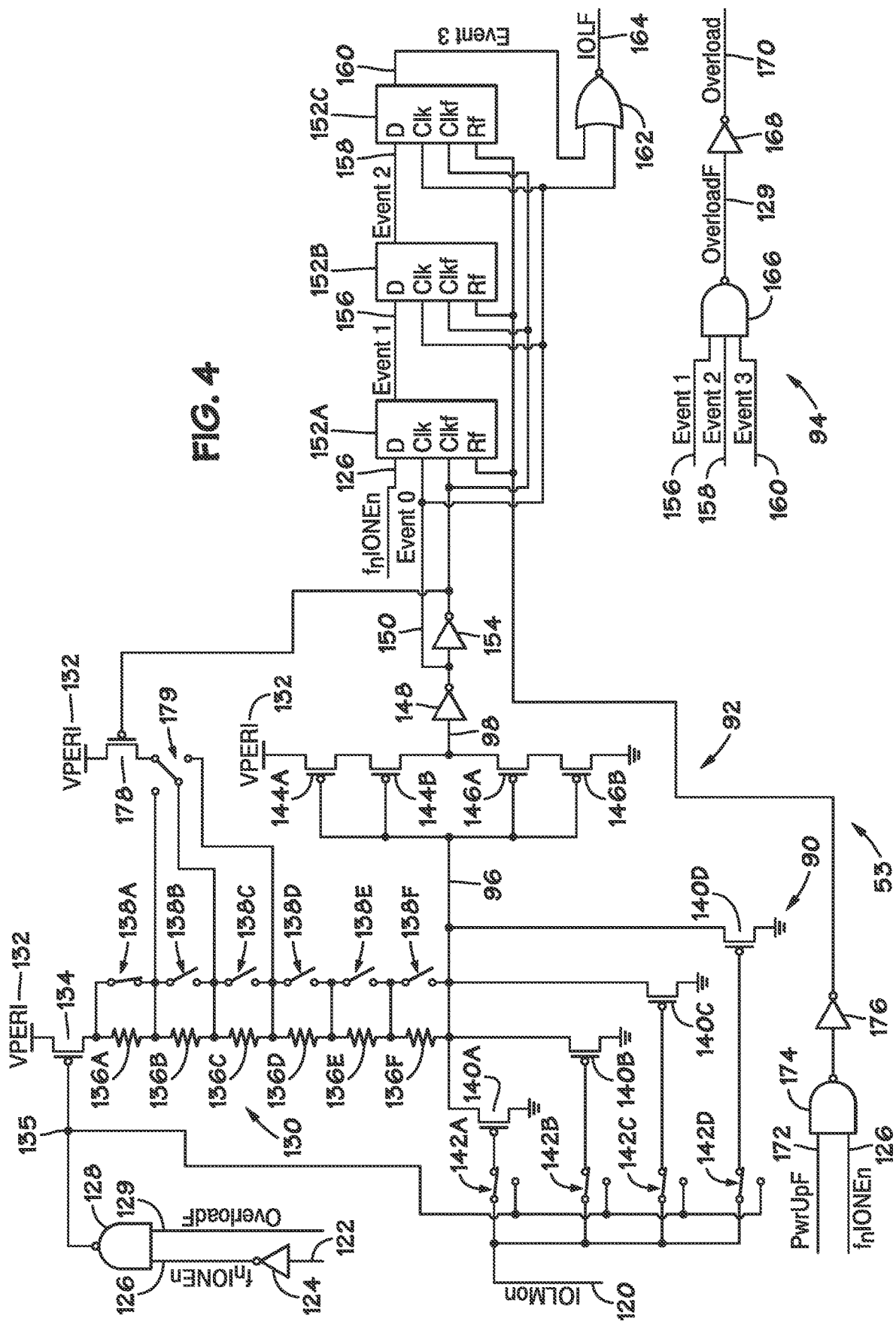
FIG. 4 is a schematic diagram of an example of the monitor circuit of FIG. 2, in accordance with the second embodiment of the present disclosure.

FIG. 4 is a schematic diagram of an embodiment of the monitor circuit 53 (or monitor circuit 102). The monitor circuit 53 receives a monitored signal 120. For example, the monitored signal 120 may include the output from the recording circuit 52 or some other value (e.g., voltage and/or current) to be monitored. The monitor circuit 53 also receives an enable signal 122 that indicates whether the monitor circuit 53 is to enable monitoring for the monitored signal 120. The enable signal 122 is received at an inverter 124 that generates an fnIONEn signal 126 from the enable signal 122, where the fnIONEn signal 126 is to be used to activate/deactivate monitoring in the monitor circuit 53. The fnIONEn signal 126 is transmitted to an input of a NAND gate 128. The NAND gate 128 also receives an OverLoadF signal 129 at another input of the NAND gate 128.

The monitor circuit 53 also includes a tuning stack 130 that utilizes a voltage 132 to tune the local voltage level 96 from the voltage 132. A transistor 134 controls whether the local voltage level 96 is generated by the tuning stack 130 based on whether monitoring is enabled (e.g., via the fnIONEn signal 126) and whether an overload or underload condition (e.g., the OverLoadF signal 129) has occurred. As such, an output 135 of the NAND gate 128 is transmitted to a gate of transistor 134 to control whether the local voltage level 96 is generated. The tuning stack 130 includes one or more resistors 136, individually referred to as resistors 136A, 136B, 136C, 136D, 136E, and 136F. The resistors 136 are used to step down the voltage 132 to a level determined by the amount of resistance applied to the voltage 132 via the resistors 136. The tuning stack 130 may be used to tune the voltage by selectively bypassing one or more of the resistors 136 using respective switches 138, individually referred to as switches 138A, 138B, 138C, 138D, 138E, and 138F. For instance, the switch 138A may be used to bypass the resistor 136A, the switch 138B may be used to bypass the resistor 136B, the switch 138C may be used to bypass the resistor 136C, the switch 138D may be used to bypass the resistor 136D, the switch 138E may be used to bypass the resistor 136E, and the switch 138F may be used to bypass the resistor 136F. Although the illustrated embodiment shows six resistors 136 and six switches 138, any number of resistors 136 and switches 138 may be used. Furthermore, although the number of illustrated number of resistors 136 is equal to the number of switches 138, some embodiments may include different numbers of resistors 136 and switches 138.

The monitor circuit 53 may be used to pull down the local voltage level 96 by applying the monitored signal to a gate of one or more transistors 140, individually referred to as transistors 140A, 140B, 140C, and 140D. The number of transistors 140 determine a width of pull down connections indicating how much voltage may be discharged from the local voltage level 96. Each transistor 140 may have the monitored signal 120 applied to its gate via a respective switch 142, individually referred to as switches 142A, 142B, 142C, and 142D. The switches 142 may also be used to selectively couple the gates of the transistors 140 to the output 135.

The local voltage level 96 is applied to gates of PMOS transistors 144A and 144B. The PMOS transistors 144A and 144B are configured to pull up the indication 98 towards the voltage 132 when the local voltage level 96 is below a first threshold corresponding to a threshold voltage of the PMOS transistors 144A and 144B. The local voltage level 96 is also applied to gates of NMOS transistors 146A and 146B. NMOS transistors 146A and 146B are configured to pull down the indication 98 towards ground when the local voltage level 96 is above a second threshold corresponding to a threshold voltage of the NMOS transistors 146A and 146B. Although the illustrated embodiment includes two PMOS transistors 144A and 144B and two NMOS transistors 146A and 146B, some embodiments may include fewer or more NMOS transistors and/or PMOS transistors.

The indication 98 indicates whether an event has occurred. The indication 98 is transmitted to an inverter 148 to generate an Event0 signal 150. The Event0 signal 150 transitions high when an event has occurred. In some embodiments, the Event0 signal 150 may be used to turn off and/or restart one or more portions (e.g., amplifiers and/or supplies) of the memory device 10.

In some embodiments, the disabling of the one or more portions may only occur after a threshold number (e.g., 3) of events have been recorded. For example, the output circuit 94 may include one or more latches 152 to smooth an output of the one or more signals 100 to occur when the threshold number of events have been surpassed. The monitor circuit 53 may include any suitable number of latches 152. For instance, the illustrated embodiment of the monitor circuit 53 includes latches 152A, 152B, and 152C. The latch 152A receives the Event0 signal 150 at a clock input of the latch and a complementary version of the Event0 signal 150 transmitted from an inverter 154 at a complementary clock input. When the Event0 signal 150 transitions high and the fnIONEn signal 126 is asserted indicating that monitoring is enabled, the latch 152A latches high and outputs a logical high in an Event1 signal 156. Similarly, after the Event1 signal 156 has transitioned high, a subsequent event captured by the Event0 signal 150 causes the latch 152B to output a logical high in an Event2 signal 158. Likewise, after the Event2 signal 158 has transitioned high, a subsequent event captured by the Event0 signal 150 causes the latch 152C to output a logical high in an Event3 signal 160. The Event0 signal 150 and the Event3 signal 160 are transmitted to an OR gate 162 to output an IOLF signal 164 that may be used to shut down and/or restart the one or more portions (e.g., amplifiers and/or supplies) of the memory device 10.

Furthermore, the Event1 signal 156, the Event2 signal 158, and the Event3 signal 160, when all high, may be an indication of an overload. Accordingly, the Event1 signal 156, the Event2 signal 158, and the Event3 signal 160 may each be transmitted to a NAND gate 166 to generate the OverLoadF signal 129. The OverLoadF signal 129 may also be inverted using inverter 168 to generate an OverLoad signal 170. The OverLoadF signal 129 and/or the OverLoad signal 170 may be used to disable the one or more portions of the memory device 10 until the memory device 10 is restarted when a single event corresponds to a restart of the amplifier without enforcing a shut down of the memory device until the memory device 10 restarts. Additionally or alternatively, the OverLoadF signal 129 and/or the OverLoad signal 170 may be used to alert the memory device 10 and/or a host device of the overload condition.

A restart of the memory device 10 may reset the latches 152 to restart monitoring with no latched events. When a reset of the memory device 10 occurs, a PwrUpF signal 172 may be used to set the memory device 10 in a powering up state. The PwrUpF signal 172 and the fnIONEn signal 126 are both transmitted to a NAND gate 174. An output of the NAND gate 174 is transmitted to an inverter 176. The output of the inverter 176 is used to reset the latches 152 to restart monitoring of the monitored signal 120.

In some embodiments, the monitor circuit 53 may use hysteresis in generation of the local voltage level 96. Specifically, a complement of the Event0 signal 150 (e.g., the indication 98) may be fed back into a hysteresis transistor 178 that selectively couples the voltage 132 to a hysteresis switch 179 that selectively couples the hysteresis transistor 178 to one or more locations between the resistors 136 to adjust the local voltage level 96 based on a voltage level of the Event0 signal 150 using hysteresis.

Figure 5:
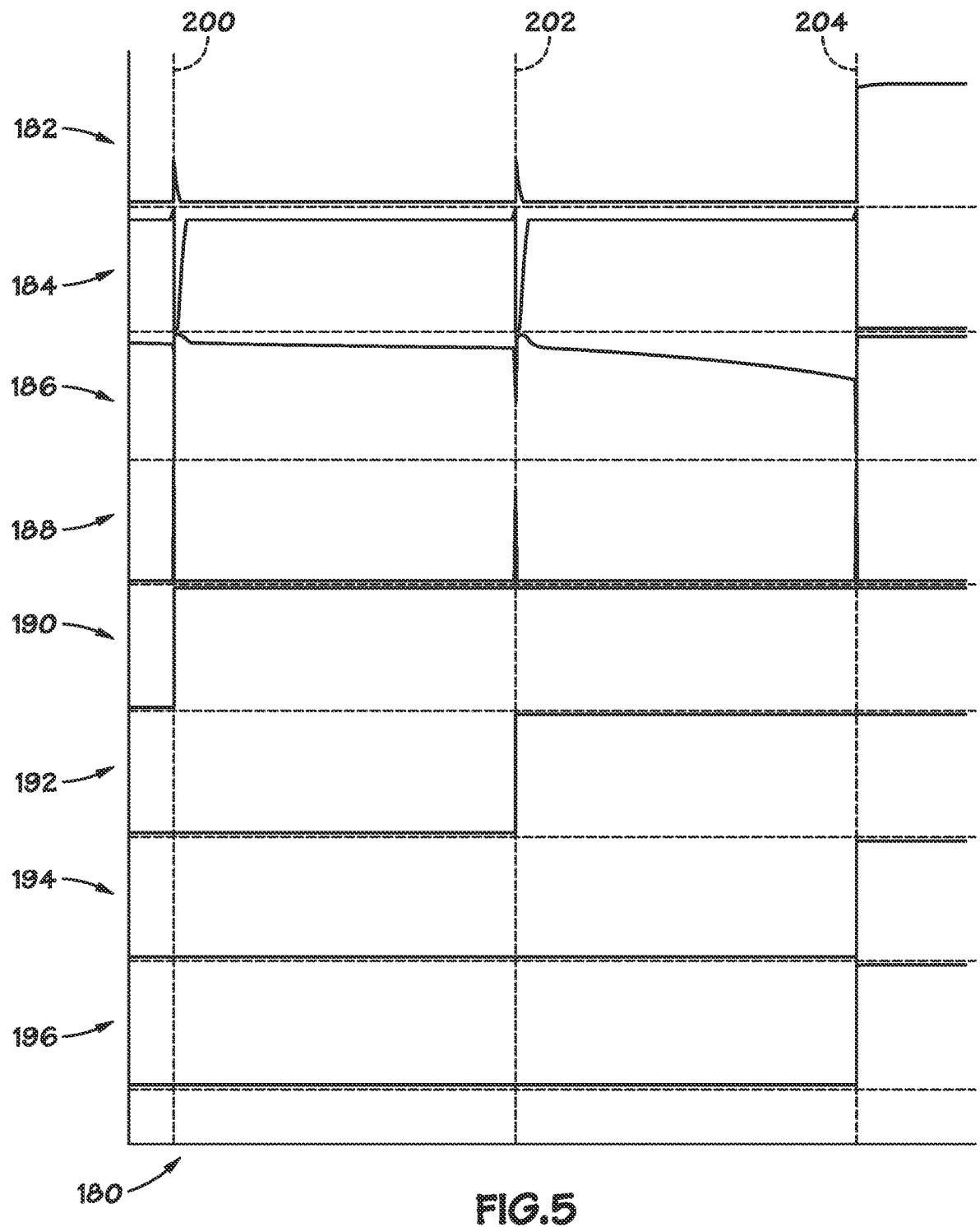
FIG. 5 is a timing graph of the monitor circuit of FIG. 4, in accordance with an embodiment of the present disclosure.

FIG. 5 is a timing graph 180 of voltages in the monitor circuit 53. The timing graph 180 includes a line 182 corresponding to a voltage on the monitored signal 120. A line 184 corresponds to the local voltage level 96. A line 186 corresponds to the indicator 98. A line 188 corresponds to the Event0 signal 150. A line 190 corresponds to the Event1 signal 156. A line 192 corresponds to the Event2 signal 158. A line 194 corresponds to the Event3 signal 160. A line 196 corresponds to the OverLoad signal 170.

At time 200, a first pulse occurs on the monitored signal 96 as indicated by the line 182. As illustrated by the line 184, the first pulse causes the local voltage level 96 to be pulled down via the transistors 140. As illustrated by the line 186, the pull down of the local voltage level 96 causes a corresponding pulse of the Event0 signal 150 indicating capture of an undervoltage/overcurrent event. The pulse in the Event0 signal 150 at time 200 causes the latch 152A to latch in the fnIONEn signal 126, which is a logical high due to the enablement of the monitoring circuit 53 via the enable signal 122.

At time 202, a second pulse occurs on the monitored signal 96 as indicated by the line 182. Similar to the first pulse at the time 200, the second pulse propagates through the local voltage level 96 to the indication 98 to the Event0 signal 150. However, since the Event1 signal 156 has previously transitioned high, the pulse on the Event0 signal 150 causes the latch 152B to latch in the Event1 signal 156 to drive the Event2 signal 158 high.

At time 204, a third pulse occurs on the monitored signal 96 as indicated by the line 182. Similar to the first pulse at the time 200 and the second pulse at the time 202, the third pulse propagates through the local voltage level 96 to the indication 98 to the Event0 signal 150. However, since the Event2 signal 158 has previously transitioned high, the pulse on the Event0 signal 150 causes the latch 152C to latch in the Event2 signal 158 to drive the Event3 signal 160 high. After the Event1 signal 156, the Event2 signal, and the Event3 signal 160 transition high, the NAND gate 166 causes the OverLoad signal 170 to transition to a logical high.

As previously discussed, the OverLoad signal 170 may be used to reset and/or disable one or more portions (e.g., amplifiers and/or sources) in the memory device 10 to protect a live die of the memory device 10 from being subjected to persistent out-of-specification parameters. For instance, the illustrated embodiment pertains to an undervoltage condition that may correspond to an overcurrent condition. However, similar techniques may be used for overvoltage and/or undercurrent conditions. For instance, the transistors 140 that are illustrated as NMOS transistors may be instead implemented as PMOS transistors to detect overvoltage conditions.

Furthermore, although the foregoing discussion relates to an undervoltage and/or overcurrent condition in the data logging circuit 38 of the memory device 10, the monitor circuit 53 may be applied to any circuitry that may benefit from undercurrent, overcurrent, overvoltage, and/or undervoltage protection. To invert such protection, at least some transistors may be replaced with opposite logic transistors (e.g., PMOS transistors replacing NMOS transistors).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

In this way, in the examples described above, memory devices are described in the context of DRAM devices. Memory device configures in accordance with other embodiments of the present technology, however, may include other types of suitable storage media in addition to or in lieu of DRAM devices, such as devices incorporating NAND-based and/or NOR-based non-volatile storage media (e.g., NAND flash), magnetic storage media, phase-change storage media, ferroelectric storage media, or the like.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
an amplifier; and
a monitor circuit, comprising:
a generation circuit configured to receive an input to the amplifier and to generate a local voltage level from the input, wherein the local voltage level indicates whether a parameter of the input has crossed a threshold out of a defined range of operation, wherein the generation circuit comprises one or more pulldown transistors and generating the local voltage level comprises pulling the local voltage level down via the one or more transistors when the parameter of the input has crossed the threshold;
a detection circuit configured to receive the local voltage level, to detect that the local voltage level has crossed the threshold, and to generate an indication; and
an output circuit configured to receive the indication and output a control signal to toggle a state of the amplifier.

2. The device of claim 1, wherein toggling the state comprises restarting the amplifier.

3. The device of claim 1, wherein the output circuit comprises one or more latches to count a number of successive events before toggling the state of the amplifier.

4. The device of claim 3, wherein a first latch of the one or more latches comprises a first data input that is coupled to a monitoring enable signal.

5. The device of claim 4, wherein each subsequent latch of the one or more latches has a respective data input that is configured to receive an output from a previous latch to capture occurrences of the successive events.

6. The device of claim 5, wherein a last latch of the one or more latches is configured to output the control signal, wherein the control signal is configured to shut down the amplifier until a restart of the semiconductor device has occurred.

7. The device of claim 3, wherein each of the one or more latches is configured to receive a reset input signal that is configured reset latches upon a restart of the semiconductor device, wherein the reset input signal is based at least in part on a power up signal for the semiconductor device.

8. The device of claim 1, wherein the parameter comprises a current or a voltage of the input to a gate of a transistor of the amplifier.

9. The device of claim 8, wherein the threshold indicates an undercurrent, an overvoltage, an overcurrent, or an undervoltage condition of the current or voltage.

10. A method, comprising:
receiving a monitored signal at a gate of an amplifier;
receiving the monitored signal at a monitor circuit;
generating, in the monitor circuit, a local voltage level based at least in part a parameter of the monitored signal;
generating, in the monitor circuit, an indication of an event occurring on the monitored signal based at least in part on the local voltage level, wherein the event comprises the parameter of the monitored signal passing a threshold, wherein generating the local voltage level comprises pulling the local voltage level down via one or more transistors when the event occurs;
generating, in the monitor circuit, a control signal based on the indication; and
sending, by the monitor circuit, the control signal to toggle a state of the amplifier.

11. The method of claim 10, wherein generating the local voltage level comprises generating the local voltage level from a supply voltage using a tuning stack comprising a plurality of resistors and switches.

12. The method of claim 10, wherein the parameter comprises a current or voltage of the monitored signal.

13. The method of claim 10, wherein generating the indication comprises:
using the local voltage level, pulling the indication to a first voltage when the event has not occurred; and
using the local voltage level, pulling the indication to a second voltage when the event has occurred.

14. The method of claim 10, wherein generating the control signal comprises:
latching successive events into a plurality of latches; and
outputting the control signal in response to the event propagating through a last latch of the plurality of latches.

15. The method of claim 14, wherein the state of the amplifier comprises a shutdown of the amplifier.

16. The method of claim 10, wherein the state of the amplifier comprises a restart of the amplifier.

17. A monitoring circuitry, comprising:
an input configured to receive a monitored signal;
a generation circuit configured to generate a local voltage level from a supply voltage based at least in part on the monitored signal, wherein the generation circuit comprises a plurality of pulldown transistors that are configured to pull down the local voltage level based on a voltage in the monitored signal crossing a threshold voltage for the plurality of pulldown transistors;
a detection circuit configured to generate an indication of an event based on the local voltage level, wherein the indication is configured to indicate that the threshold voltage has been crossed in the monitored signal, wherein the detection circuit comprises:
a first set of transistors configured to receive the local voltage level at respective gates to selectively couple the indication to a first voltage; and
a second set of transistors configured to receive the local voltage level at respective gates to selectively couple the indication to a second voltage; and
an output circuit configured to output a control signal configured to control one or more devices based on the indication.

18. The monitoring circuitry of claim 17, wherein the output circuit comprises a plurality of latches each comprising:
a respective clock input that is controlled by the indication; and
an output configured to indicate that a number of events corresponding to the respective latch has been detected by the detection circuit.

19. The monitoring circuitry of claim 18, wherein the output circuit comprises a combination gate that is configured to transition the control signal when each of the outputs of the plurality of latches has transitioned to a same logic value.

20. The device of claim 3, wherein each of the successive events comprises the parameter crossing the threshold.

* * * * *